United States Patent [19]
Kobayashi et al.

[11] Patent Number: 4,548,871
[45] Date of Patent: Oct. 22, 1985

[54] MAGNETIC RECORDING MEDIUM

[75] Inventors: Kouji Kobayashi; Kiyoshi Noguchi; Suguru Takayama, all of Tokyo, Japan

[73] Assignee: TDK Corporation, Tokyo, Japan

[21] Appl. No.: 562,002

[22] Filed: Dec. 16, 1983

[30] Foreign Application Priority Data

Dec. 26, 1982 [JP] Japan ................. 57-232698

[51] Int. Cl.$^4$ ............................... G11B 5/66
[52] U.S. Cl. ................... 428/593; 428/611; 428/928; 428/637; 428/639; 428/668; 428/678; 360/134
[58] Field of Search ........... 428/611, 928, 668, 678, 428/679, 629, 593, 639, 637; 360/134, 135

[56] References Cited

U.S. PATENT DOCUMENTS

| | | | |
|---|---|---|---|
| 4,172,171 | 10/1979 | Suzuki et al. | 360/134 |
| 4,323,629 | 4/1982 | Kunieda et al. | 428/680 |
| 4,371,590 | 2/1983 | Izumi et al. | 428/611 |
| 4,385,098 | 5/1983 | Sugita et al. | 428/629 |
| 4,387,136 | 6/1983 | Saito et al. | 360/135 |
| 4,409,281 | 10/1983 | Kitamoto et al. | 360/134 |
| 4,410,583 | 10/1983 | Hanaoka | 428/611 |
| 4,418,126 | 11/1983 | Izumi et al. | 360/134 |

FOREIGN PATENT DOCUMENTS 14324  1/1983  Japan .................. 360/134

*Primary Examiner*—L. Dewayne Rutledge
*Assistant Examiner*—John J. Zimmerman
*Attorney, Agent, or Firm*—Oblon, Fisher, Spivak, McClelland & Maier

[57] ABSTRACT

A magnetic recording medium which comprises a magnetic layer formed on a substrate and comprising Co, or Co and one to three elements selected from the group consisting of Ni, Cr and O, said magnetic layer comprising sequentially from the substrate side, a first portion composed of crystal particles which are not inclined relative to the normal line of the principal plane of the substrate, a second portion composed of columnar crystal particles which are inclined relative to the normal line of the principal plane of the substrate, and a third portion composed of crystal particles which are not inclined relative to the normal line of the principal plane of the substrate.

8 Claims, No Drawings

MAGNETIC RECORDING MEDIUM

BACKGROUND OF THE INVENTION

1. Field of the Invention

The present invention relates to a magnetic recording medium, and particularly to a magnetic recording medium having a magnetic layer of a continuous thin film type formed by a so-called oblique vapor deposition.

2. Description of the Prior Art

In order to attain compact winding of video and audio recording tapes, there has been active research to develop a magnetic recording medium having a magnetic layer of a continuous thin film type.

As a magnetic layer for such a continuous thin film type medium, a vapor deposited magnetic layer composed of e.g. Co, Co—Ni, Co—O or Co—Ni—O is most suitable from a view point of the desired characteristics, which is formed by a so-called oblique vapor deposition method in which the vapor deposition is conducted at a predetermined inclined angle relative to the normal line of the substrate.

The thin magnetic layer formed by such an oblique vapor deposition method is composed of columnar crystal particles which are inclined relative to the normal line of the principal plane of the substrate and which have a length corresponding to the thickness of the magnetic layer. Co, Ni, etc. are present in the columnar crystal particles, and optionally incorporated O is present in the form of an oxide on the surface of the columnar crystal particles.

However, such a magnetic layer has drawbacks such that it is susceptible to oxidation and its corrosion resistance is poor.

Further, it has an additional drawback that the strength of the layer is poor, and particularly when it is used for a video recording medium, the durable time for the static image mode which is commonly called "still", is short. Under the circumstances, it has been proposed to form various organic or inorganic thin protective layers on the above-mentioned magnetic layer. However, although such a protective layer improves the corrosion resistance, it does not improve the strength of the magnetic layer. Besides, due to a spacing loss by the provision of the protective layer, the electromagnetic conversion characteristics will be lowered, and the output and S/N ratio will also be lowered.

Further, in order to improve the bonding strength of the layer, it has been proposed to provide a undercoat for the magnetic layer. However, a fully satisfactory result has not yet been obtained with respect to the strength and corrosion resistance of the magnetic layer and the running property.

Further, there has been known a continuous thin magnetic layer having the above-mentioned composition, which is formed by e.g. so-called vertical vapor deposition, sputtering or plating and which is composed of columnar crystal particles arranged along the normal line of the principal plane of the substrate. It has also been proposed to apply various protective layers or undercoating layers to such a magnetic layer. However, even such a layer does not fully satisfy the desired properties such as the strength of the layer, corrosion resistance and running property.

SUMMARY OF THE INVENTION

The present invention to provides a magnetic recording medium having a magnetic layer formed by an oblique vapor deposition method and comprising Co as the essential component, which has improved layer strength and corrosion resistance as well as a good running property. Such an object is accomplished by the following invention.

The present invention provides a magnetic recording medium which comprises a magnetic layer formed on a substrate and comprising Co, or Co and one to three elements selected from the group consisting of Ni, Cr and O, said magnetic layer comprising, sequentially from the substrate side, a first portion composed of crystal particles which are not inclined relative to the normal line of the principal plane of the substrate, a second portion composed of columnar crystal particles which are inclined relative to the normal line of the principal plane of the substrate, and a third portion composed of crystal particles which are not inclined relative to the normal line of the principal plane of the substrate.

DETAILED DESCRIPTION OF THE PREFERRED EMBODIMENTS

The present invention will be described in detail with reference to the preferred embodiments.

The magnetic recording medium of the present invention has a magnetic layer on a substrate.

The magnetic layer contains Co as an essential component, and usually comprises Co, Co+Ni, Co+O or Co+Ni+O.

The magnetic layer may be composed of Co alone, or it may be composed of Co and Ni. In the case of Co+Ni, the weight ratio of Co/Ni is preferably at least 1.5.

Further, the magnetic layer may contain O in addition to Co or Co+Ni. When O is incorporated, better results will be obtained with respect to the electromagnetic conversion characteristics or running durability.

In such a case, the atomic ratio of O/Co (no Ni is contained) or O/(Co+Ni) is preferably at most 0.2, more preferably from 0.01 to 0.1. When the magnetic layer contains Cr in addition to Co, Co+Ni, Co+O or Co+Ni+O, still better results are obtainable.

The electromagnetic conversion characteristics as well as the output and S/N ratio will thereby be improved, and the strength of the layer will also be improved.

In such a case, the weight ratio of Cr/Co (no Ni is contained) or Cr/(Co+Ni) is preferably from 0.001 to 0.1.

In this case, the weight ratio of Cr/Co or Cr/(Co+Ni) is preferably from 0.005 to 0.5, whereby a further improvement will be obtained.

Further, such a magnetic layer may additionally contain a small amount of other components, particularly transition elements such as Fe, Mn, V, Zr, Nb, Ta, Mo, W, Ti, Cu or Zn.

The magnetic layer having such an overall composition comprises the first, second and third portions.

The third portion is composed of crystal particles which are not inclined relative to the normal line of the principal plane of the substrate. Here, the term "not inclined" is meant to include a case where the crystal particles may be inclined within a range of ±10° relative to the above-mentioned normal line.

Each particle usually has a length corresponding to the thickness of the third portion. In some cases, however, the particles may not necessarily be fully grown to have a length equal to the thickness of the third portion.

The short diameter of the crystal particles is usually from 50 to 500 A.

Such particles contain Co, Ni, Cr, etc. When O is incorporated, it will be present on the surface of the particles in a form bound to the metal.

Such a third portion preferably has a thickness of from 50 to 500 A, more preferably, from 100 to 300 A.

If the thickness is less than 50 A, no adequate corrosion resistance is obtainable, and if the thickness exceeds 500 A, the electromagnetic conversion characteristics will be inadequate.

Whereas, the second portion is composed of crystal particles which are inclined relative to the normal line of the principal plane of the substrate.

In such a case, the columnar crystal particles of the second portion are preferably inclined at an angle of at least 30° relative to the normal line of the principal plane of the substrate.

Further, each columnar crystal particle has a length corresponding to the thickness of the second portion, and its diameter is usually from 50 to 500 A.

Co, Ni, Cr, etc. are present in the crystal particles, whereas O is present mainly on the surface of the columnar crystal particles.

Such a second portion preferably has a thickness of from 500 to 5000 A, preferably from 700 to 3000 A. If the thickness is outside the range, no adequate electromagnetic conversion characteristics will be obtained.

Like the above-mentioned third portion, the first portion is composed of crystal particles which are not inclined relative to the normal line of the principal plane of the substrate.

Here, the term "not inclined" is meant to include a case where the crystal particles may be inclined within a range of ±10° relative to the above-mentioned normal line.

Each particle usually has a length corresponding to the thickness of the first portion. In some cases, however, the particles may not necessarily be fully grown to have a thickness equal to the thickness of the first portion.

The diameter of the particles is usually from 50 to 500 A.

Such particles contain Co, Ni, Cr, etc. When O is incorporated, it will be present in the form of an oxide on the surface of the particles.

Such a first portion preferably has a thickness of from 50 to 2000 A, more preferably from 500 to 1000 A. If the thickness is less than 50 A, no adequate layer strength will be obtainable, and if the thickness exceeds 2000 A, the electromagnetic conversion characteristics tend to be impaired.

The total thickness of the magnetic layer comprising the first to third portions, is usually from 600 to 5000 A.

The magnetic layer comprising the first to third portions is usually formed directly on the substrate. However, in some cases, it may be formed on a suitable undercoating layer formed on the substrate.

In this case, the first and third portions are formed usually by sputtering or a so-called vertical vapor deposition method. Further, they may be formed by plating. The forming condition can be selected from a wide range. Further, it is possible to apply various after-treatments for introducing O after the formation.

Whereas, the second portion is formed usually by an oblique vapor deposition method. As the oblique vapor deposition method, a known method may be employed, wherein the minimum value of the incident angle relative to the nomal line of the principal plane of the substrate is preferably at least 30°.

Conventional conditions for the vapor deposition and after-treatments may be employed. In this case, there are various treating methods for introducing O into the layer as the after-treatments.

The substrate to be used is not critical. However, a flexible substrate, particularly a substrate made of a resin such as polyester or polyimide, is particurally preferred.

Further, the substrate may have various thickness. However, a thickness of from 5 to 20 μm is preferred.

The RMS value of the height of the surface roughness of the rear surface opposite to the magnetic layer-forming surface of the substrate is preferably at least 0.05 μm, whereby the electromagnetic conversion characteristics will be improved.

To the magnetic recording medium of the present invention having the above-mentioned construction, a top layer made of various organic and inorganic materials may be formed on the magnetic layer, as the case requires.

The magnetic recording medium of the present invention is useful as a magnetic recording medium for video or audio recording tapes.

The magnetic recording medium according to the present invention has extremely high corrosion resistance such as acid resistance or moisture resistance.

Further, the strength of the layer becomes extremely high, and the durable time in the still mode becomes extremely long.

There is no substantial reduction of the electromagnetic conversion characteristics, and the output and S/N ratio are high.

Furthermore, the running friction is low, and the running durability is high.

Now, the present invention will be described in further detail with reference to Examples. However, it should be understood that the present invention is by no means restricted by these specific Examples.

EXAMPLES

EXAMPLE 1

The following first to third portions were sequentially formed in lamination on a polyethyleneterephthalate (PET) film having a thickness of 12 μm, whereby Sample A0 was obtained as a magnetic recording medium of the present invention.

(1) First portion

A layer having a thickness of 0.05 μm was formed by RF sputtering with use of a Co-Ni alloy having a weight ratio of Co/Ni being 4 in an atmosphere of $P_{Ar}=1\times10^{-1}$ Pa and $P_{O2}=1\times10^{-1}$ Pa.

(2) Second portion

A layer having a thickness of 0.15 μm was formed by an oblique vapor deposition method with use of the above-mentioned Co-Ni alloy. In this case, the incident angle for the vapor deposition was 50°, and the atmosphere was such that $P_{Ar}=2\times10^{-2}$ Pa and $P_{O2}=2\times10^{-2}$ Pa.

(3) Third portion

A layer having a thickness of 0.03 μm was formed by RF sputtering with use of the above-mentioned Co-Ni alloy in an atmosphere of $P_{Ar}=1\times10^{-1}$ Pa and $P_{O2}=1\times10^{-1}$ Pa.

In this case, each of the first to third portions had a composition of Co/Ni=4 (weight ratio) and O/(Co+Ni)=0.02 (atomic ratio).

Further, each portion is composed of columnar crystal particles having a length of from 100 to 200 Å and fully grown to the thickness of the respective layer. In this case, in the first and third portions, the columnar crystals were substantially vertical to the principal plane of the substrate, whereas in the second portion, the columnar crystals were inclined at an angle of 40° relative to the normal line of the principal plane of the substrate.

Further, from the Auger spectroscopic analysis under ion miling, it was found that in each portion, Co and Ni were present in the columnar crystals, and O was present in the form of oxide on the surface of the crystals.

Separately, Samples A1 to A3 as shown in the following Table 1 were obtained by omitting at least a part of the above-mentioned portions (1) to (3).

Each Sample was left to stand at 50° C. under relative humidity of 90% for seven days, whereupon the change of the magnetic flux $\Delta\phi m$ per 1 cm$^2$ of the Sample was measured by a vibrating sample magnetometer, and the corrosion resistance was evaluated.

Further, by means of a commercially available VTR apparatus, a still mode test was conducted, and the time until the reproduction output became ½ of the initial value, was measured, and the strength of the layer was evaluated.

The results thereby obtained are shown in Table 1.

Table 1 further includes test results of Samples A4 and A5 wherein the above-mentioned first portion was changed to a layer of 0.1 m formed by vertical vapor deposition of Ti and Al under an atmosphere of $P_{Ar}=2\times10^{-2}$ Pa and $P_{O2}=0.5\times10^{-2}$ Pa.

TABLE 1

| | Samples | | | | | |
|---|---|---|---|---|---|---|
| | A0 (present invention) | A1 | A2 | A3 | A4 | A5 |
| Construction | | | | | | |
| (1) First portion | present | absent | present | absent | Ti | Al |
| (2) Second portion | present | present | present | present | present | present |
| (3) Third portion | present | absent | absent | present | present | present |
| Corrosion resistance | | | | | | |
| $\Delta\phi m$ (%) | 8 | 16 | 14 | 10 | 25 | 27 |
| Strength of the layer | | | | | | |
| Time for the reduction of the output to ½ by the still mode test | at least 10 min. | at most 1 min. | 5 min. | 3 min. | 5 min. | 5 min. |

From the results shown in Table 1, the effectiveness of the present invention is evident.

Further, Sample A0 showed no trouble when subjected to the actual running test.

Example 2

The following first to third portions were formed in the same manner as in Example 1 except that the Co-Ni alloy was replaced by a Co-Ni-Cr alloy having a weight ratio of Co/Ni/Cr=75/20/5, whereby Samples B0 to B3 as shown in Table 2 were obtained.

(1) First portion

A layer having a thickness of 0.1 μm was formed by RF sputtering in an atmosphere of $P_{Ar}=1\times10^{-1}$ Pa and $P_{O2}=1\times10^{-1}$ Pa. Co/Ni/Cr=75/20/5 (weight ratio), and O/(Co+Ni)=0.02 (atomic ratio).

(2) Second portion

A layer having a thickness of 0.2 μm was formed by an oblique vapor deposition method at an incident angle of 45° in an atmosphere of $P_{Ar}=2\times10^{-2}$ Pa and $P_{O2}=1.5\times10^{-2}$ Pa. Co/Ni/Cr=75/20/5 (weight ratio), and O/(Co+Ni)=0.02 (atomic ratio).

(3) Third portion

A layer having a thickness of 0.02 μm was prepared under the same conditions as the formation of the above-mentioned first portion.

The results thereby obtained are shown in Table 2.

TABLE 2

| | Samples | | | |
|---|---|---|---|---|
| | B0 (present invention) | B1 | B2 | B3 |
| Construction | | | | |
| (1) First portion | present | absent | present | absent |
| (2) Second portion | present | present | present | present |
| (3) Third portion | present | absent | absent | present |
| Corrosion resistance | | | | |
| $\Delta\phi m$ (%) | 5 | 12 | 11 | 7 |
| Strength of the layer | | | | |
| Time for the reduction of the output to ½ by the still mode test | at least 10 min. | at most 1 min. | 6 min. | 3 min. |

From the results shown in Table 2, the effectiveness of the present invention is evident.

Further, Sample B0 showed no trouble when subjected to the actual running test.

What is claimed is:

1. A magnetic recording medium which comprises a magnetic layer formed on a substrate and comprising Co, or Co and one to three elements selected from the group consisting of Ni, Cr and O, said magnetic layer comprising sequentially from the substrate side, a first portion composed of crystal particles which are not inclined relative to the normal line of the principal plane of the substrate, a second portion composed of columnar crystal particles which are inclined relative to the normal line of the principal plane of the substrate, and a third portion composed of crystal particles which are not inclined relative to the normal line of the principal plane of the substrate.

2. The magnetic recording medium according to claim 1, wherein the first portion has a thickness of from 50 to 2,000 Å.

3. The magnetic recording medium according to claim 1, wherein the second portion has a thickness of from 500 to 5,000 Å.

4. The magnetic recording medium according to claim 1, wherein the third portion has a thickness of from 50 to 500 Å.

5. The magnetic recording medium according to claim 1 wherein the magnetic layer has a thickness of from 600 to 5,000 Å.

6. The magnetic recording medium according to claim 1, wherein the magnetic layer contains Ni, and the weight ratio of Co/Ni is at least 1.5.

7. The magnetic recording medium according to claim 1, wherein the magnetic layer contains Cr, and the weight ratio of Cr/(Co or Co+Ni) is from 0.001 to 0.1.

8. The magnetic recording medium according to claim 1, wherein the magnetic layer contains O, and the weight ratio of O/(Co or Co+Ni) is at most 0.2.

* * * * *